(12) United States Patent
Kim

(10) Patent No.: US 6,985,394 B2
(45) Date of Patent: Jan. 10, 2006

(54) INTEGRATED CIRCUIT DEVICES INCLUDING INPUT/OUTPUT LINE PAIRS AND PRECHARGE CIRCUITS AND RELATED MEMORY DEVICES

(75) Inventor: Sung-hoon Kim, Kyungki-do (KR)

(73) Assignee: Samsung Electronics Co., Ltd, Kyunggi-do (KR)

( * ) Notice: Subject to any disclaimer, the term of this patent is extended or adjusted under 35 U.S.C. 154(b) by 134 days.

(21) Appl. No.: 10/651,181

(22) Filed: Aug. 28, 2003

(65) Prior Publication Data

US 2004/0109373 A1 Jun. 10, 2004

(30) Foreign Application Priority Data

Dec. 5, 2002 (KR) .............................. 10-2002-0077035

(51) Int. Cl.
*G11C 7/00* (2006.01)

(52) U.S. Cl. ....................................... 365/203; 365/207
(58) Field of Classification Search ................ 365/203, 365/207, 63, 189.08
See application file for complete search history.

(56) References Cited

U.S. PATENT DOCUMENTS 6,175,532 B1 * 1/2001 Ooishi ................... 365/230.03
6,256,245 B1 * 7/2001 Kwak ......................... 365/203
6,816,416 B2 * 11/2004 Won ....................... 365/189.02
2003/0214866 A1 * 11/2003 Kyung ........................ 365/205
2004/0085841 A1 * 5/2004 Lim et al. ................... 365/203

FOREIGN PATENT DOCUMENTS

KR         0057284        7/2002

* cited by examiner

*Primary Examiner*—Anh Phung
(74) *Attorney, Agent, or Firm*—Myers Bigel Sibley & Sajovec

(57) ABSTRACT

An integrated circuit device may include a pair of first and second input/output lines on a substrate and a precharge circuit connected to the first and second input/output lines. More particularly, portions of the first and second input/output lines may extend in a parallel direction along first lengths thereof, portions of the first and second input/output lines may cross one another in a twist region so that portions of the first and second input/output lines in the twist region extend in directions different than the parallel direction, and portions of the first and second input/output lines may extend in the parallel direction along second lengths. Accordingly, relative positions of the first and second input/output lines may be reversed in the first and second lengths thereof. In addition, the precharge circuit may be connected to portions of the first and second input/output lines in the twist region extending in the directions different than the parallel direction, and the precharge circuit may be configured to provide that the first and second input/output lines have a same electrical potential responsive to an enable signal. Related memory devices are also discussed.

11 Claims, 3 Drawing Sheets

INTEGRATED CIRCUIT DEVICES INCLUDING INPUT/OUTPUT LINE PAIRS AND PRECHARGE CIRCUITS AND RELATED MEMORY DEVICES

RELATED APPLICATIONS

This application claims the benefit of priority from Korean Patent Application No. 2002-77035 filed on Dec. 5, 2002, in the Korean Intellectual Property Office, the disclosure of which is incorporated herein in its entirety by reference.

FIELD OF THE INVENTION

The present invention relates to integrated circuit devices, and more particularly, to integrated circuit devices with input/output line pairs and related memory devices.

BACKGROUND OF THE INVENTION

In semiconductor devices, various input/output lines (IO lines) may be used to read data from a memory cell or write data to a memory cell. Since a pair of IO lines may have different voltage levels after an IO line performs a write command or a read command, the IO line may be precharged before performing a next command.

An IO line of a semiconductor device may include a first IO line coupled to a bit line coupled to a memory cell via a column select circuit, and a second IO line coupled to the first IO line via a switch circuit. Here, the first IO line may be called a "local input/output line (LIO)," and the second IO line may be called a "global input/output line (GIO)."

Both the LIO and the GIO may be precharged after performing a first command and before performing a next command. Here, a precharge circuit of the GIO may be positioned at a peripheral region of a memory device and may precharge the GIO to a predetermined level between two commands.

As the density of a memory array increases, however, the distance between a peripheral region and a memory array region may also increase. If the distance is too great, a precharge circuit in the peripheral region may be unable to charge the GIO with sufficient speed. Thus, the precharge circuit of the GIO, positioned at the peripheral region, may not precharge or equalize the GIO in a given period of time.

In addition, while the density of a memory array increases, the operating speed of a memory device may also increase. Therefore, the precharge circuit of the GIO, positioned at the peripheral region, may not be able to precharge the IO line in a given period of time allowed at a higher operating speed.

If the IO line is not precharged in a given period of time allowed for a particular specification, operation errors may occur when data is written to or read from a memory. For this reason, a precharge circuit may be needed that can precisely precharge data IO lines at a high speed. Accordingly, a semiconductor device with a layout that can reduce the precharge time of GIOs may be desired.

SUMMARY OF THE INVENTION

According to embodiments of the present invention, an integrated circuit device may include a pair of first and second input/output lines on a substrate and a precharge circuit connected to the first and second input/output lines. Portions of the first and second input/output lines may extend in a parallel direction along first lengths thereof, portions of the first and second input/output lines may cross one another in a twist region so that portions of the first and second input/output lines in the twist region extend in directions different than the parallel direction, and portions of the first and second input/output lines may extend in the parallel direction along second lengths thereof. Accordingly, relative positions of the first and second input/output lines may be reversed in the first and second lengths thereof. More particularly, the precharge circuit may be connected to portions of the first and second input/output lines in the twist region extending in the directions different than the parallel direction. Moreover, the precharge circuit can be configured to provide that the first and second input/output lines have a same electrical potential responsive to an enable signal.

In addition, the precharge circuit may include a transistor having first and second source/drain regions and a control electrode between the first and second source/drain regions wherein the transistor electrically connects the first and second input/output lines responsive to the enable signal being applied to the gate electrode. More particularly, the first source/drain region may be connected to a portion of the first input/output line extending in a direction different than the parallel direction in the twist region, and the second source/drain region may be connected to a portion of the second input/output line extending in a direction different than the parallel direction in the twist region. Moreover, the transistor may be a metal-oxide-semiconductor MOS transistor.

In addition or in an alternative, the precharge circuit may include first and second serially connected transistors. The first transistor may have a first source/drain region connected to a portion of the first input/output line extending in a direction different than the parallel direction in the twist region, a second source/drain region connected to a voltage source, and a control electrode between the first and second source/drain regions. The second transistor may have a third source/drain region connected to a portion of the second input/output line extending in a direction different than the parallel direction in the twist region, a fourth source/drain region connected to the voltage source, and a control electrode between the third and fourth source/drain regions. Moreover, the voltage source may be electrically connected to the first and second input/output lines responsive to the enable signal being applied to the control electrodes of the first and second transistors. More particularly, the voltage source may provide a voltage of approximately ½ of a power supply voltage for the integrated circuit device, and the first and second transistors may be first and second metal-oxide-semiconductor MOS transistors.

Portions of the first and second input/output lines may extend in a first parallel direction along the first and second lengths thereof, and portions of the first and second input/output lines may extend in a second parallel direction different than the first parallel direction in the twist region. Moreover, the first parallel direction may be perpendicular to the second parallel direction.

The integrated circuit device may also include first and second memory cells, first and second bit lines respectively connected to the first and second memory cells, and a selection circuit connected between the first and second bit lines and the first and second input/output lines. The selection circuit may electrically connect the first bit line to the first input/output line and may electrically connect the second bit line to the second input/output line responsive to a selection signal. An input/output line sense amplifier may also be electrically connected between the first and second input/output lines, and the precharge circuit may be connected to portions of the input/output lines at a point along the input/output lines between the input/output sense amplifier and the selection circuit. In addition, a bit line sense amplifier may be connected between the first and second bit lines.

According to additional embodiments of the present invention, an integrated circuit memory device may include first and second memory cells, first and second bit lines respectively connected to the first and second memory cells, and first and second input/output lines. A selection circuit may be connected between the first and second bit lines and the first and second input/output lines wherein the selection circuit electrically connects the first bit line to the first input/output line and electrically connects the second bit line to the second input/output line responsive to a selection signal. A precharge circuit may be connected to the first and second input/output lines wherein the precharge circuit is configured to provide that the first and second input/output lines have a same electrical potential responsive to an enable signal. An input/output line sense amplifier may be electrically connected between the first and second input/output lines wherein the precharge circuit is connected to the input/output lines between the input/output sense amplifier and the selection circuit. A bit line sense amplifier may also be connected between the first and second bit lines.

More particularly, the precharge circuit may include a transistor having a first source/drain region connected to the first input/output line, a second source/drain region connected to the second input/output line, and a control electrode between the first and second source/drain regions. The transistor may electrically connect the first and second input/output lines responsive to the enable signal being applied to the gate electrode. Moreover, the transistor may be a metal-oxide-semiconductor MOS transistor.

In addition or in an alternative, the precharge circuit may include first and second serially connected transistors. The first transistor may have a first source/drain region connected to the first input/output line, a second source/drain region connected to a voltage source, and a control electrode between the first and second source/drain regions. The second transistor may have a third source/drain region connected to the second input/output line, a fourth source/drain region connected to the voltage source, and a control electrode between the third and fourth source/drain regions. Moreover, the voltage source may be electrically connected to the first and second input/output lines responsive to the enable signal being applied to the control electrodes of the first and second transistors. In addition, the voltage source may provide a voltage of approximately ½ of a power supply voltage for the integrated circuit device, and the first and second transistors may include first and second metal-oxide-semiconductor MOS transistors.

Portions portions of the first and second input/output lines may extend in a parallel direction along first lengths thereof, portions of the first and second input/output lines may cross one another in a twist region so that portions of the first and second input/output lines in the twist region extend in directions different than the parallel direction, and portions of the first and second input/output lines may extend in the parallel direction along second lengths thereof. Accordingly, relative positions of the first and second input/output lines may be reversed in the first and second lengths thereof. Moreover, the precharge circuit may be connected to portions of the first and second input/output lines in the twist region extending in the directions different than the parallel direction. Moreover, portions of the first and second input/ output lines may extend in a first parallel direction along the first and second lengths thereof, and portions of the first and second input/output lines may extend in a second parallel direction different than the first parallel direction in the twist region. More particularly, the first parallel direction may be perpendicular to the second parallel direction.

The integrated circuit memory device may also include a second precharge circuit electrically connected between the first and second input/output lines. The second precharge circuit may be configured to provide that the first and second input/output lines have a same electrical potential responsive to a second enable signal, and the first precharge circuit and the first and second memory cells may be located in a memory cell array region of the memory device. Moreover, the second precharge circuit and the input/output line sense amplifier may be located in a peripheral circuit region separate from the memory cell array region. The first and second enable signals may be enabled simultaneously and/or disabled simultaneously. In alternatives, the first enable signal may be enabled after the second enable signal is enabled, and/or the first enable signal may be disabled before the second enable signal is disabled.

In addition, the precharge circuit may be configured to equalize an electrical potential of the first and second input/output lines responsive to the enable signal. In addition or in an alternative, the precharge circuit may also be configured to precharge the first and second input/output lines to a predetermined electrical potential responsive to the enable signal.

DETAILED DESCRIPTION OF THE INVENTION

The present invention will be described more fully hereinafter with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

Figure 1:
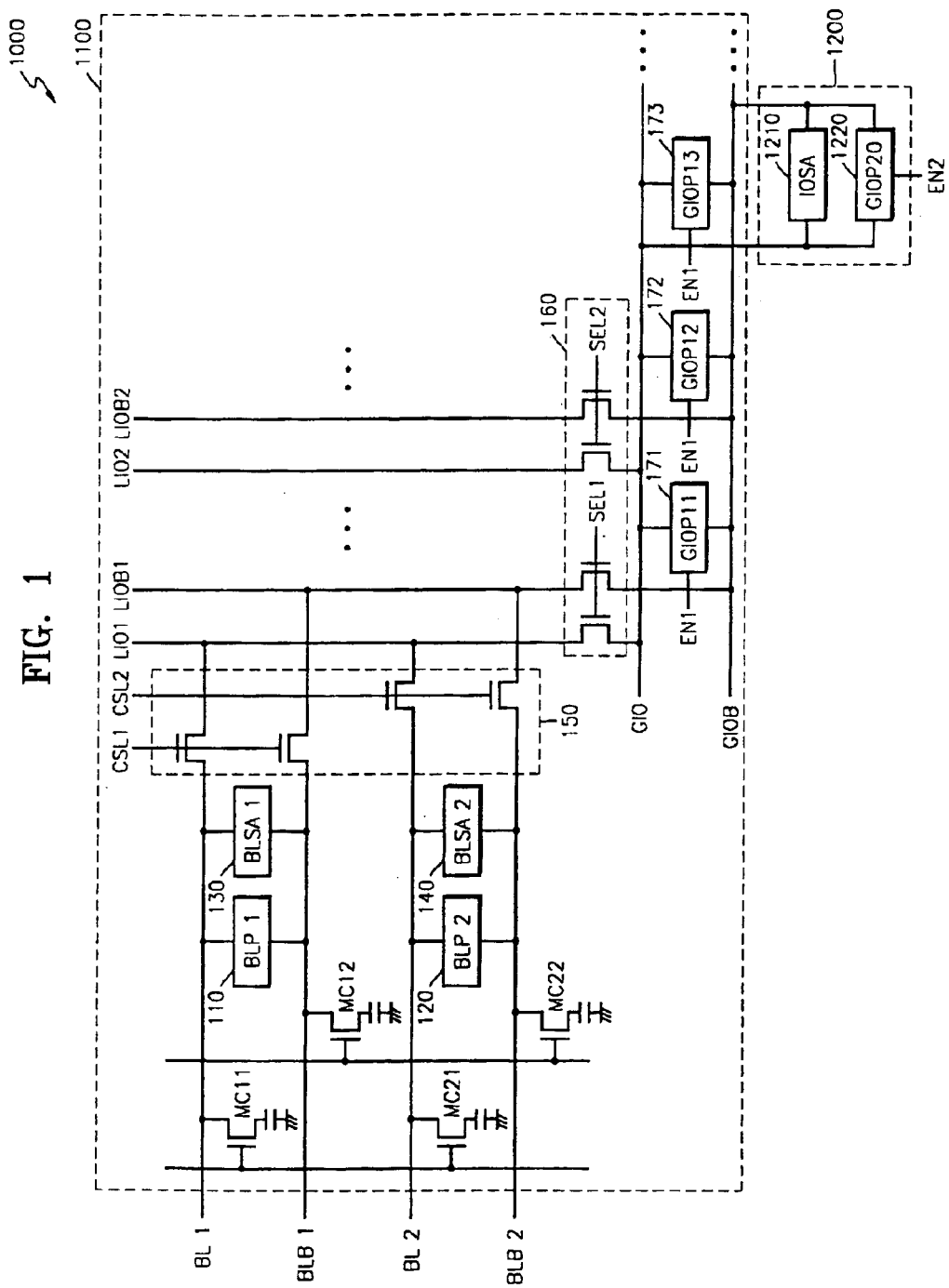
FIG. 1 is a schematic diagram illustrating semiconductor devices including precharge circuits according to embodiments of the present invention.

FIG. 1 illustrates a semiconductor device including a precharge circuit according to embodiments of the present invention. The semiconductor device 1000 illustrated in FIG. 1 is divided into an array region 1100 and a peripheral region 1200.

The array region 1100 includes a plurality of memory cells MC11, MC12, MC21, and MC22; a plurality of pairs of bit lines (BL1, BLB1) and (BL2, BLB2); a plurality of pairs of local input/output lines (LI01, LI0B1) and (LI02, LI0B2); and a plurality of pairs of global input/output lines GIO and GIOB. The plurality of pairs of bit lines (BL1, BLB1) and (BL2, BLB2) are coupled to the memory cells and transmit data of the memory cells. The plurality of pairs of local input/output lines (LIO1, LIOB1) and (LIO2, LIOB2) are respectively coupled to the corresponding pairs of bit lines. The plurality of pairs of global input/output lines GIO and GIOB are respectively coupled to the corresponding pairs of local input/output lines.

The array region 1100 may further include bit line precharge circuits 110 and 120, sense amplifiers 130 and 140, a first switching circuit 150, a second switching circuit 160, and a plurality of first precharge circuits 171, 172, and 173. The bit line precharge circuits 110 and 120 are respectively coupled to the pairs of bit lines to precharge the plurality of pairs of bit lines (BL1, BLB1) and (BL1, BLB2). The sense amplifiers 130 and 140 sense and amplify data transmitted to the pairs of bit lines. The first switching circuit 150 selectively couples the pair of local input/output lines (LIO1, LIOB1) to the pairs of bit lines (BL1, BLB1) and/or (BL2, BLB2) in response to predetermined control signals CSL1 and CSL2. The second switching circuit 160 selectively couples the pairs of local input/output lines (LIO1, LIOB1) and/or (LIO2, LIOB2) to the pair of global input/output lines GIO and GIOB in response to predetermined control signals SEL1 and SEL2. The plurality of first precharge circuits 171, 172, and 173 precharge the pairs of global input/output lines GIO and GIOB in response to a first precharge control signal EN1.

The peripheral region 1200 includes an input/output line sense amplifier 1210 which is coupled to ends of both of the global input/output lines GIO and GIOB. The input/output line sense amplifier 1210 senses data of the pairs of the global input/output lines GIO and GIOB, and amplifies and outputs the data. A second precharge circuit 1220 is disposed in the vicinity of the input/output line sense amplifier 1210, is coupled to the input/output line sense amplifier 1210, and precharges the pair of global input/output lines GIO and GIOB in response to a second precharge control signal EN2.

Although not shown in FIG. 1, the semiconductor device 1000 may include a plurality of pairs of global input/output lines, each pair of which outputs a single bit of data. Thus, the semiconductor device including the plurality of pairs of global input/output lines can perform a burst read and/or write operation.

The plurality of pairs of local input/output lines (LIO1, LIOB1) and (LIO2, LIOB2) are coupled to the pair of global input/output lines GIO and GIOB. As more pairs of local input/output lines are coupled to a single pair of global input/output lines GIO and GIOB, the second precharge circuit 1220 of the peripheral region 1200 may perform precharge operations more slowly.

In the semiconductor device 1000 according to embodiments of the present invention, the first precharge circuits 171, 172, and 173 may be disposed at the array region 1100 and not at the peripheral region 1200. As a result, a precharge time can be reduced as compared to a device in which circuits for precharging pairs of global input/output lines GIO and GIOB are all disposed at a peripheral circuit region of the device.

Figure 2A:
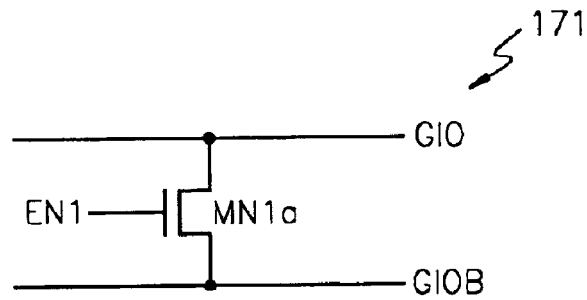
FIGS. 2A–2C are schematic diagrams illustrating first precharge circuits according to embodiments of the present invention.
Figure 2B:
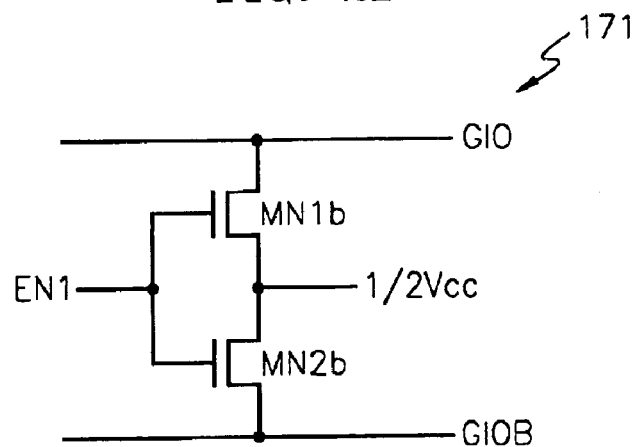
Figure 2C:
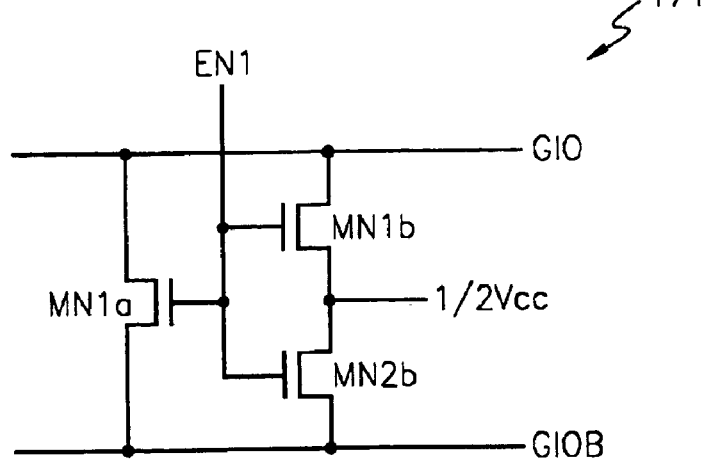

FIGS. 2A–2C illustrate first precharge circuits 171 of FIG. 1 according to embodiments of the present invention. In a first example of FIG. 2A, the first precharge circuit 171 can be a circuit which equalizes the pair of global input/output lines GIO and GIOB in response to the first precharge control signal EN1. As illustrated in the first example of FIG. 2A, the first precharge circuit 171 may be embodied as an n-MOS transistor MN1*a* having a gate coupled to the first precharge control signal EN1 and having sources/drains coupled to the pair of global input/output lines GIO and GIOB, respectively.

In a second example of FIG. 2B, the first precharge circuit 171 can be embodied as a circuit which precharges the pair of global input/output lines GIO and GIOB to a predetermined voltage level. Here, the predetermined voltage is ½ of a power supply voltage VCC.

The first precharge circuit 171 illustrated in the second example of FIG. 2B can be embodied by n-MOS transistors MN1*b* and MN2*b* which are connected in series between the global input/output lines GIO and GIOB. That is, gates of the n-MOS transistors MN1*b* and MN2*b* can be connected to the first precharge control signal EN1, and a source of the n-MOS transistor MN1*b* can be coupled to a drain of the n-MOS transistor MN2*b*. A voltage value of ½ a power supply voltage can be applied to a terminal between the source and the drain of the series connected transistors. A drain of the n-MOS transistor MN1*b* can be coupled to the global input/output line GIO, while a source of the n-MOS transistor MN2*b* can be coupled to the global input/output line GIOB.

The first precharge circuit 171 illustrated in a third example of FIG. 2C can be embodied including a combination of both circuits of the first and second examples of FIGS. 2A and 2B. That is, the first precharge circuit 171 can be embodied as a circuit which equalizes the pair of global input/output lines GIO and GIOB, a circuit which precharges the pair of global input/output lines GIO and GIOB, or a circuit which equalizes and precharges the pair of global input/output lines GIO and GIOB.

While the first precharge circuit 171 illustrated in the examples of FIGS. 2A–C can be embodied by one or a plurality of n-MOS transistors MN1*a*, MN1*b*, and MN2*b*, the precharge circuit 171 can alternately be embodied using one or a plurality of p-MOS transistors instead of or in combination with n-MOS transistors. When p-MOS transistors are used to embody the first precharge circuit 171, the size of a layout may be increased. For this reason, the first precharge circuit 171 may be embodied using n-MOS transistors.

Figure 3:
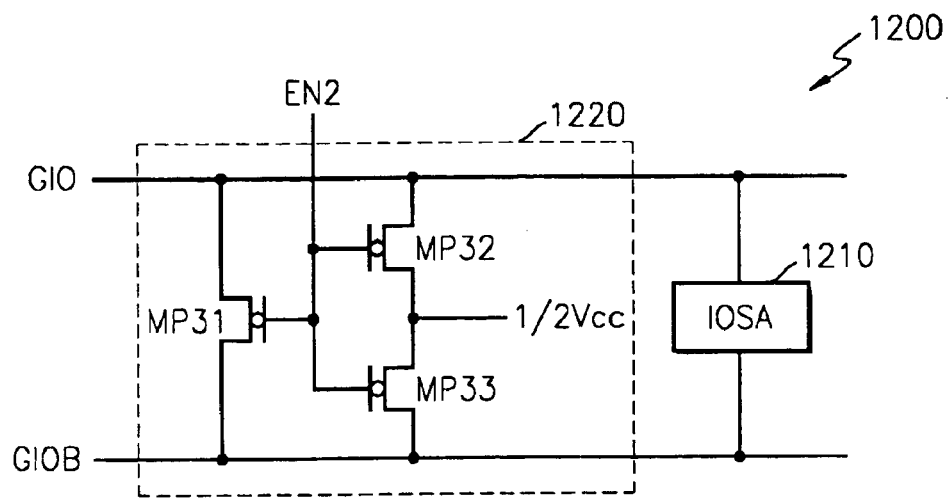
FIG. 3 is a schematic diagram illustrating second precharge circuits according to a embodiments of the present invention.

FIG. 3 illustrates an embodiment of the second precharge circuit 1220 of FIG. 1. The second precharge circuit 1220 of FIG. 3 can be embodied by a plurality of MOS transistors MP31, MP32, and MP33 and may also include circuits which precharge and/or equalize the global input/output lines in response to the second precharge control signal EN2.

Gates of the MOS transistors MP31, MP32, and MP33 are connected in common to the second precharge control signal EN2, and a source and a drain of the MOS transistor MP31 are respectively connected to the global input/output lines GIO and GIOB.

A drain of the MOS transistor MP32 is coupled to a source of the MOS transistor MP33, and voltage of ½ a power supply voltage VCC is applied to a terminal between the source and the drain of the transistors MP32 and MP33. A source of the MOS transistor MP32 is coupled to the global input/output line GIO, while a drain of the MOS transistor MP33 is coupled to the global input/output line GIOB.

As described above, while the second precharge circuit 1220 of FIG. 3 can be embodied using a plurality of p-MOS transistors MP31, MP32, and MP33, the second precharge circuit 1220 can be embodied using n-MOS transistors instead of the p-MOS transistors. To reduce a size of a layout, the second precharge circuit 1220 can be embodied by n-MOS transistors.

The first precharge circuits 171 of FIGS. 2A–C and the second precharge circuit 1220 of FIG. 3 may precharge the pair of global input/output lines GIO and GIOB to a predetermined voltage level in response to the first precharge control signal EN1 and the second precharge control signal EN2, respectively.

Here, the first and second precharge control signals EN1 and EN2 may be simultaneously enabled. However, to improve a precharge time or a timing margin, the precharge control signals may be adjusted to be enabled or disabled at slightly different times in consideration of other conditions.

For example, if the first and second precharge control signals EN1 and EN2 are adjusted such that the first precharge control signal EN1 is enabled simultaneously with the second precharge control signal EN2 or after the second precharge control signal EN2 is enabled, and the first precharge control signal EN1 is disabled simultaneously with the second precharge control signal EN2 or before the second precharge control signal EN2 is disabled, subsequent write or read operations may be performed with a reduction in failures.

Figure 4A:
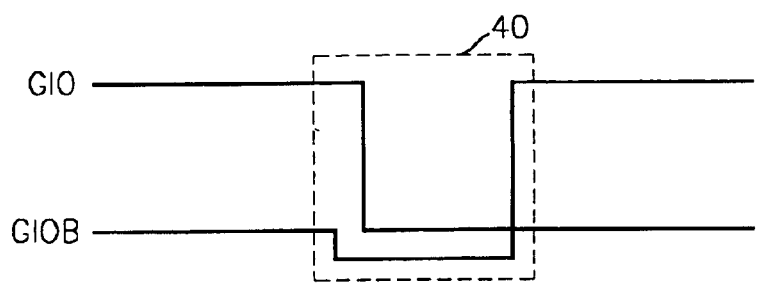
FIGS. 4A–4B are diagrams illustrating transistors for precharging or equalizing global input/output lines according to embodiments of the present invention, disposed on global input/output lines.
Figure 4B:
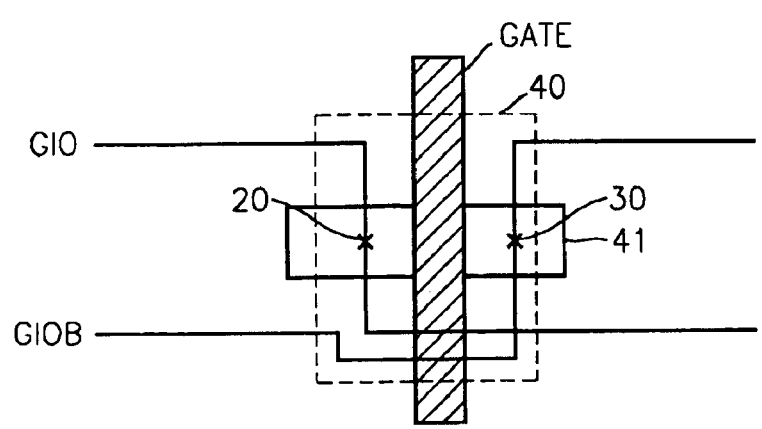

FIGS. 4A–B illustrate a MOS transistor for precharging and/or equalizing global input/output lines according to embodiments of the present invention, wherein the precharge circuit is disposed on the global input/output lines. FIG. 4A illustrates the global input/output lines GIO and GIOB being twisted in a particular region, and FIG. 4B illustrates the layout of a transistor which precharges and/or equalizes the global input/output lines using the twist region 40.

A semiconductor device performing a burst read operation may include a plurality of pairs of global input/output lines. Here, if a plurality of pairs of global input/output lines are disposed in the semiconductor device, a large coupling capacitance may result between the pairs of global input/output lines that are arranged in the same direction.

Therefore, as illustrated in FIG. 4A, twisting the pair of global input/output lines in a particular region can be used to reduce an effect of coupling capacitance. As illustrated in FIG. 4A, the global input/output lines GIO and GIOB may exchange relative positions at the twist region 40.

The layout of the transistor illustrated in FIG. 4B may include the pairs of global input/output lines GIO and GIOB including the twist region 40 in the middle thereof, a first contact 20, a second contact 30, and a gate poly-silicon electrode GATE. The twist region 40 is a region where the pair of global input/output lines, which are arranged in a first direction (e.g., a horizontal direction), exchange relative positions. The first global input/output line GIO and the second global input/output line GIOB exchange realtive positions at the twist region 40.

The first contact 20 is a region where the first global input/output line GIO disposed at the twist region 40 is coupled to a first source/drain of the active region 41 of the transistor, and the second contact 30 is a region where the second global input/output line GIOB disposed at the twist region 40 is coupled to a second source/drain of the active region 41 of the transistor. The gate poly-silicon electrode GATE is formed over the active region 41.

As illustrated in FIG. 4B, when the pair of global input/output lines GIO and GIOB disposed at the twist region 40 are coupled to the active region 41 via the first and second contacts 20 and 30, circuits which precharge and/or equalize the global input/output lines GIO and GIOB can be embodied without significantly increasing the layout size of the semiconductor device.

As set forth above, in the semiconductor device according to embodiments of the present invention, precharge circuits which precharge and/or equalize pairs of global input/output lines can be disposed not only at a peripheral region but also at an array region. Accordingly, the pairs of global input/output lines can be precharged at both the array region and the peripheral region at a same given time. In addition, a transistor which precharges and/or equalizes pairs of global input/output lines can be embodied without significantly increasing the layout size of a semiconductor device.

Embodiments of the present invention may provide semiconductor devices in which global input/output lines can be precharged in relatively short periods of time. Embodiments of the present invention may also provide layouts of semiconductor devices by which a precharge circuit can be provided without increasing layout sizes.

In accordance with embodiments of the present invention, there is provided a semiconductor device including a pair of local input/output lines (LIO), a pair of global input/output lines (GIO), an IO line sense amplifier, and a plurality of first precharge circuits. The pair of local input/output lines (LIO) are coupled to a pair of bit lines via a first switching circuit. The pair of global input/output lines (GIO) are coupled to the pair of GIOs via a second switching circuit. The IO line sense amplifier is coupled to the pair of GIOs and senses and amplifies data of the pair of GIOs and outputs the amplified data. The plurality of first precharge circuits are disposed between the second switching circuit and the IO line sense amplifier, are coupled to the pair of GIOs, and precharge the pair of GIOs in response to a first precharge control signal.

The first precharge circuit may include an equalizing unit which equalizes the pair of GIOs. The first precharge circuit may also include a precharging unit which precharges the pair of GIOs.

The semiconductor device may further include a second precharge circuit that is disposed relatively close to the IO line sense amplifier, that is coupled to the IO line sense amplifier, and that precharges the pair of GIOs in response to a second precharge control signal.

In accordance with additional embodiments of the present invention, a transistor may be provided that precharges and/or equalizes a pair of GIOs of a semiconductor device. The transistor may include the pair of GIOs arranged in a first direction, of which a first GIO and a second GIO exchange positions at a predetermined twist region and are arranged in the first direction, a first contact where the first GIO existing at the twist region is connected to a drain region of the transistor, a second contact where the second GIO existing at the twist region is connected to a source region of the transistor, and a gate poly which is formed on an active region of the transistor.

The pair of GIOs may also be arranged in a second direction at the twist region and the first direction may be perpendicular to the second direction. More particularly, the transistor may be an n-MOS transistor.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A semiconductor memory device having a memory cell array region and a peripheral circuit region separate from the memory cell array region, the semiconductor memory device comprises:
 a plurality of memory cells;
 a pair of bit lines which is coupled respectively to a pair of memory cells of the plurality of memory cells;
 a pair of local input/output lines which is coupled to the pair of bit lines via a first switching circuit;
 a pair of global input/output lines which is coupled to the pair of local input/output lines via a second switching circuit;
 an input/output line sense amplifier, coupled to the pair of global input/output lines, for sensing and amplifying data of the pair of global input/output lines and outputting the amplified data; and
 a plurality of first precharge circuits, disposed between the second switching circuit and the input/output line sense amplifier and coupled to the pair of global input/output lines, for precharging the pair of global input/output lines in response to a first precharge control signal,
 wherein the plurality of memory cells, the pair of bit lines, the pair of local input/output lines, the pair of global input/output lines, and the plurality of first precharge circuits are located in the memory cell array region, and wherein the input/output line sense amplifier is located in the peripheral circuit region.

2. The memory device as claimed in claim 1, wherein the memory device further includes a second precharge circuit, disposed close to the input/output line sense amplifier and coupled to the input/output line sense amplifier, for precharging the pair of global input/output lines in response to a second precharge control signal,
 wherein the second precharge circuit is located in the peripheral circuit region.

3. The memory device as claimed in claim 2, wherein the first precharge control signal is enabled or disabled simultaneously with the second precharge control signal.

4. The memory device as claimed in claim 2, wherein the first precharge control signal is enabled simultaneously with the second precharge control signal or after the second precharge control signal is enabled, and is disabled simultaneously with the second precharge control signal or before the second precharge control signal is disabled.

5. The memory device as claimed in claim 1, wherein the plurality of first precharge circuits comprise a transistor having source/drain electrodes coupled to the pair local input/output lines, respectively, and gate electrode coupled to the first precharge control signal wherein the transistor electrically connects the pair of global input/output lines responsive to the first precharge control signal.

6. The memory device as claimed in claim 1, wherein the plurality of first precharge circuits comprise first and second serially connected transistors:
 wherein the first transistor has source/drain electrodes coupled to one of the pair local input/output lines and a voltage source, respectively, and gate electrode coupled to the first precharge control signal;
 wherein the second transistor has source/drain electrodes coupled to another of the pair local input/output lines and the voltage source, respectively, and gate electrode coupled to the first precharge control signal;
 wherein the voltage source is electrically connected the pair of global input/output lines responsive to the first precharge control signal.

7. The memory device as claimed in claim 6, wherein the voltage source provides a voltage of 1/2 of a power supply voltage for the semiconductor memory device.

8. The memory device as claimed in claim 1, wherein the plurality of first precharge circuits comprise first and second serially connected transistors and a third transistor:
 wherein the first transistor has source/drain electrodes coupled to one of the pair local input/output lines and a voltage source, respectively, and gate electrode coupled to the first precharge control signal;
 wherein the second transistor has source/drain electrodes coupled to another of the pair local input/output lines and the voltage source, respectively, and gate electrode coupled to the first precharge control signal;
 wherein the third transistor has source/drain electrodes coupled to the pair local input/output lines, respectively, and gate electrode coupled to the first precharge control signal;
 wherein the voltage source is electrically connected the pair of global input/output lines responsive to the first precharge control signal.

9. The memory device as claimed in claim 1, wherein portions of the pair local input/output lines extend in a parallel direction, wherein portions of the pair local input/output lines cross one another in a twist region so that portions of the pair local input/output lines in the twist region extend in directions different than the parallel direction, and wherein the plurality of first precharge circuits are connected to portions of the pair local input/output lines in the twist region extending in extending in the directions different than the parallel direction.

10. The memory device as claimed in claim 9, wherein portions of the pair local input/output lines extend in a first parallel direction along first lengths thereof, and wherein portions of the pair local input/output lines extend in a second parallel direction different than the first parallel direction along second lengths thereof in the twist region.

11. The memory device as claimed in claim 10, wherein the first parallel direction is perpendicular to the second parallel direction.

* * * * *